United States Patent
Guo et al.

(10) Patent No.: US 9,646,671 B1
(45) Date of Patent: May 9, 2017

(54) SYSTEMS AND METHODS FOR MANAGING WRITE VOLTAGES IN A CROSS-POINT MEMORY ARRAY

(71) Applicant: Kilopass Technology, Inc., San Jose, CA (US)

(72) Inventors: Frank Guo, Danville, CA (US); Jim Reaves, San Jose, CA (US)

(73) Assignee: Kilopass Technology, Inc., San Jose, CA (US)

( * ) Notice: Subject to any disclaimer, the term of this patent is extended or adjusted under 35 U.S.C. 154(b) by 0 days.

(21) Appl. No.: 15/288,886

(22) Filed: Oct. 7, 2016

(51) Int. Cl.
| | |
|---|---|
| G11C 11/34 | (2006.01) |
| G11C 11/39 | (2006.01) |
| G11C 13/00 | (2006.01) |
| G11C 11/36 | (2006.01) |
| G11C 11/00 | (2006.01) |

(52) U.S. Cl.
CPC ............ G11C 11/39 (2013.01); G11C 11/00 (2013.01); G11C 11/36 (2013.01); G11C 13/0004 (2013.01); G11C 13/0007 (2013.01); G11C 13/0069 (2013.01)

(58) Field of Classification Search
CPC ......... G11C 11/00; G11C 11/10; G11C 11/39; G11C 11/36; G11C 13/0004; G11C 13/0007; G11C 13/0023; G11C 13/0026; G11C 13/0028; G11C 13/0069; G11C 8/10; G11C 8/14

USPC .......... 365/180, 100, 163, 148, 171, 189.06, 365/189.07
See application file for complete search history.

(56) References Cited

U.S. PATENT DOCUMENTS

| | | | | |
|---|---|---|---|---|
| 7,248,494 B2 * | 7/2007 | Oh | ........................... | G11C 7/12 365/148 |
| 7,471,557 B2 * | 12/2008 | Johnson | ............. | G11C 13/0004 365/163 |
| 7,778,065 B2 * | 8/2010 | Lamorey | .................. | G11C 11/56 365/148 |
| 8,634,227 B2 * | 1/2014 | Yu | ............................ | G11C 8/10 365/100 |
| 8,953,363 B2 * | 2/2015 | Shimakawa | ........ | G11C 11/1673 365/148 |

* cited by examiner

*Primary Examiner* — Gene Auduong
(74) *Attorney, Agent, or Firm* — Ropes & Gray LLP

(57) ABSTRACT

Techniques are provided for managing voltages applied to memory cells in a cross-point array during a write operation (e.g., to transition from a resistive state into a conductive state). The techniques apply to thyristor memory cells and non-thyristor memory cells. Bitlines, connected by a wordline, are preconditioned to a voltage level, by a precondition device, to write data to one or more memory cells at intersections of the bitlines and the wordline. Each bitline is coupled to a high impedance device, a detect device, a precondition device and a clamp device. When a memory cell on a first bitline transitions from a resistive state into a conductive state, it pulls a voltage level of the first-bit line level low. A first clamp device maintains the voltage level at a level to de-bias the first bitline from the wordline, while other memory cells to be written along the wordline remain biased.

20 Claims, 3 Drawing Sheets

SYSTEMS AND METHODS FOR MANAGING WRITE VOLTAGES IN A CROSS-POINT MEMORY ARRAY

FIELD OF THE DISCLOSURE

The present disclosure relates generally to Random-Access Memory (RAM) memory technologies (e.g., volatile and non-volatile memories), and more particularly to memory storage that uses a cross-point array.

BACKGROUND OF THE DISCLOSURE

Cross-point memory arrays can provide a dense closely packed structure of memories. Memory cells used in cross-point memory arrays may have a resistive state and a conductive state. When a memory cell is switching from the resistive state to the conductive state, a voltage level of an electrically conducting line connected to the memory cell may be pulled to a low voltage level, which may affect operation of the memory cell. Additionally, neighboring memory cells connected by the same electrically conducting line, or another electrically conducting line connected to the memory cell may also be affected. Accordingly, techniques are needed to control the voltage levels across the memory cell during a transition from a resistive state to a conductive state.

SUMMARY OF THE DISCLOSURE

Systems and methods are provided for managing voltages applied to memory cells in a cross-point array during a write operation (e.g., to transition from a high resistance state to a low resistance state). For example, the memory cells in a cross-point memory array may be located at the intersections of a first plurality of electrically conducting lines (e.g., Bit-lines), and a second plurality of electrically conducting lines (e.g., Word-lines). In some embodiments, a memory cell in a cross-point memory array may be located at the intersection of a Bit-line and two Word-lines (e.g., two parallel or substantially parallel Word-lines), and may be connected to the Bit-line and the two Word-lines.

For example, prior to a write operation, voltage levels of Bit-lines, which are selected for writing (e.g., to transition from the high resistance state to the low resistance state), in a cross-point memory array, may be switched to a precharge voltage level. If there are leakage currents that may pull down the voltage levels of the selected Bit-lines, a high impedance device may be coupled to each Bit-line to provide a small current to maintain the voltages levels of the selected Bit-lines at the precharge voltage level. In some embodiments where the leakage currents are negligible, the high impedance device may not be needed, and may either be deactivated, or may be excluded from a memory device. In some embodiments, the high impedance device may have an impedance that is sufficient to limit current from the first voltage supply to a selected Bit-line to a level sufficient to counteract the leakage currents. For example, the high impedance device may have an impedance that is greater than 10 M-ohms. For example, the high impedance device may have an impedance that is greater than 100 M-ohms. For example, the high impedance device may have an impedance that is greater than 1 G-ohms. For example, the high impedance device may have an impedance that is greater than 10 G-ohms.

For example, to initiate a write operation of memory cells (e.g., connected by a common Word-line), a voltage level of the Word-line may be switched from a standby voltage level to a write voltage level. After the voltage level of the Word-line is switched, memory cells at the intersection of the selected Bit-lines (e.g., Bit-lines set to the precharge voltage level) and the common Word-line, may begin to transition at different times from respective high resistance states to respective low resistance states. As each of the memory cells, at the intersections of respective selected Bit-lines and the common Word-line, transition from the respective high resistance states to the respective low resistance states, current flowing through each of the memory cells accumulate into the Word-line. This accumulation of current may overload a Word-line driver, and/or affect the ability of other memory cells along the common Word-line to transition from a high resistance state to a low resistance state. In order to limit the current flowing through each respective memory cell, a respective voltage level detect device may be coupled to each respective selected Bit-line, and cause a respective high impedance device coupled to the respective selected Bit-line to shut-off the small current that was maintaining the precharge voltage level on the respective Bit-line.

For example, when a memory cell (e.g., a thyristor memory cell) at an intersection of a first Bit-line and a first Word-line transitions from a high resistance state to a low resistance state, the decrease in resistance may cause a voltage level of the first Bit-line to be pulled toward a voltage level of the first Word-line. In order to maintain a minimum voltage level of the first Bit-line, a clamp device (e.g., a voltage clamp device) may be coupled to the first Bit-line. In some embodiments, the clamp device may include a bi-polar junction transistor. In some embodiments, the clamp device may include an NMOS transistor.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION OF THE DRAWINGS

Memory cells arranged in cross-point arrays offer a promising memory technology. These memory cells in the cross-point array may be arranged as an array of minimum $4F^2$ cells, thereby minimizing cell area and reducing fabrication cost. Memory cells in a cross-point array may also be arranged in a stacked configuration to further increase the density of memory cells in a cross-point array. The memory cells in the cross-point array can be uniquely accessed without one or more select transistors. The memory cells in the cross-point array may have a high resistance state (HRS, e.g., a resistive state, non-conducting state) and a low resistance state (LRS, e.g., a conductive state, conducting state). In some embodiments, the high resistance state may be referred to as an ON state, and the low resistance state may be referred to as an OFF state. In some embodiments, the high resistance state may be referred to as an OFF state, and the low resistance state may be referred to as an ON state.

A memory cell can be selected in a cross-point array by toggling Bit-lines (BLs) and Word-lines (WLs) appropriately for read and write operations. For example, a first memory cell located at the intersection of a first BL and a first WL may be selected by biasing the first BL and/or the first WL, and subsequently sensing current at the first BL and/or the first WL to detect whether the first memory cell is in a high resistance state or a low resistance state. In some embodiments, a memory cell in a cross-point memory array may be located at the intersection of a BL and two WLs (e.g., two parallel or substantially parallel WLs). For example, the memory cell in the cross-point memory array may be connected to the BL and the two WLs. For example, each memory cell in the cross-point memory array may be connected to a respective BL and a respective pair of WLs. To avoid non-ideal current paths (e.g., sneak-paths) that may cause a high resistance state of the first memory cell to be incorrectly detected as a low resistance state, a steering device (e.g., such as a diode or other non-linear semiconductor device exhibiting rectifying behavior) may be fabricated as part of or in addition to the memory cell.
Examples of memory cells that can be used in cross-point memory array include Spin Transfer Torque-Magnetoresistive Random-Access Memory (STT-MRAM), Resistive-RAM, Phase-Change RAM, and Vertical Layer Thyristor (VLT) RAM, and One-Time Programmable (OTP) RAM.

Figure 1:
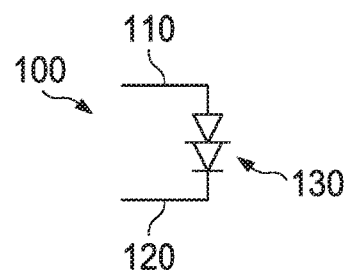
FIG. 1 depicts a diagram of a vertical layer thyristor (VLT) memory cell in accordance with some embodiments of the present disclosure.

FIG. 1 depicts a diagram of a vertical layer thyristor (VLT) memory cell in accordance with some embodiments of the present disclosure. Advantages of thyristors include the ability to precisely tune operating characteristics (e.g., switching speed, static power consumption, dynamic power consumption, etc.) by tuning the geometry and composition of component layers of each thyristor cell. VTL memory cell 100 may include a VLT 130 connected to a first electrically conducting line 110, and a second electrically conducting line 120. In some embodiments, the first electrically conducting line may be a BL, and the second electrically conducting line may be a WL. In some embodiments, the first electrically conducting line may be a WL, and the second electrically conducting line may be a BL. VLTs have an advantage over certain types of memory cells because VLTs exhibit non-linear rectifying behavior (e.g., of a diode). Accordingly, the use of a VLT memory cell may obviate the need for an additional or separate steering device.

Figure 2:
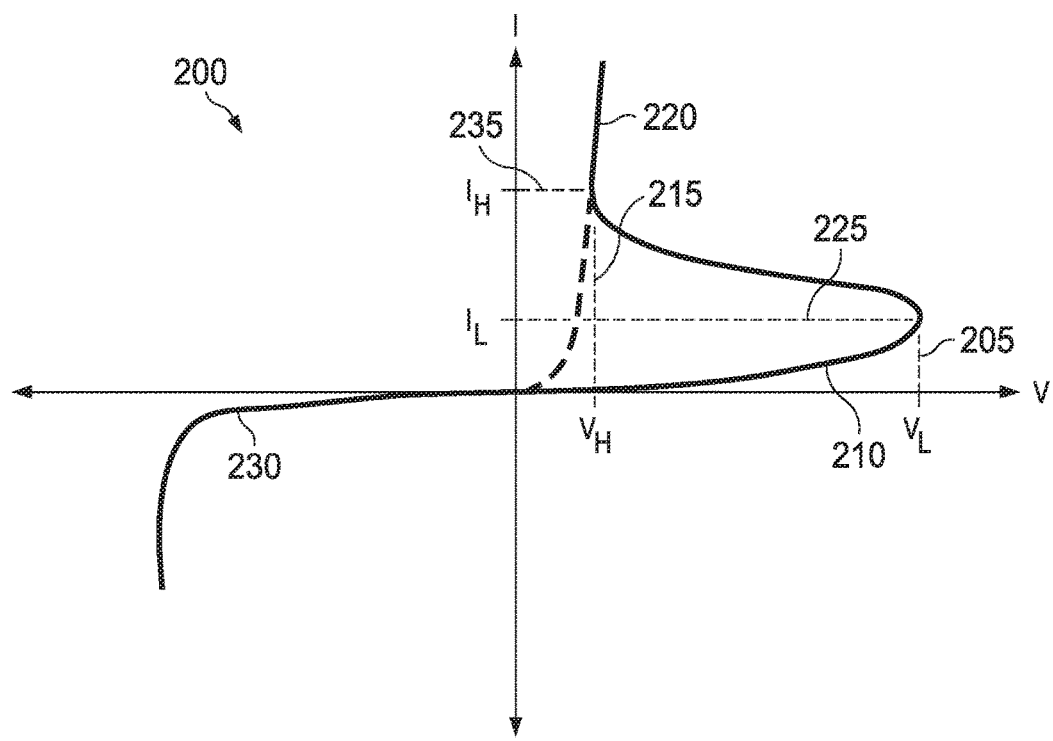
FIG. 2 depicts a current voltage graph that describes the operation of a VLT memory cell, in accordance with some embodiments of the present disclosure.

FIG. 2 depicts a current voltage (IV) graph 200 that describes the operation of a VLT memory cell (e.g., depicted in FIG. 1), in accordance with some embodiments of the present disclosure. The x-axis or independent axis may correspond to voltage applied across the VLT memory cell. The y-axis or dependent axis may correspond to current through the VLT memory cell at a particular applied voltage. It should be understood that voltage applied across the cell may correspond to a voltage difference between a first electrically conducting line (e.g., 110 of FIG. 1) and a second electrically conducting line (e.g., 120 of FIG. 1), and that the voltage levels of the first electrically conducting line and the second electrically conducting line may be non-zero (e.g., greater than or less than zero volts).

The VLT memory cell may initially be in a high resistance state, corresponding to a portion 210 of the IV graph. As voltage across the VLT memory cell increases from zero along portion 210 of the IV graph, the current across the VLT memory cell increases under high resistance. When the voltage across the VLT memory cell exceeds a first threshold voltage 205 (e.g., a breakdown voltage or latching voltage $V_L$) and/or the current through the VLT memory cell exceeds a current 225 (e.g., a latching current), the VLT memory cell transitions from the high resistance state to a low resistance state, corresponding to a portion 220 of the IV graph. The low resistance state is indicated by the steeper slope of portion 220 of the IV graph as compared to portion 210 of the IV graph. After the transition from the high resistance state to the lower resistance state, the voltage across the VLT memory cell may decrease from $V_1$ 205, to $V_2$ 215. The current may correspond to $I_2$ at 225. In the low resistance state, as voltage across the VLT memory cell increases, the current increases according to portion 220 of the IV graph. As the voltage across the VLT memory cell decreases, the current decreases according to portion 220 of the IV graph. When the voltage across the VLT memory cell, in the low resistance state, decreases below a second threshold voltage 215 (e.g., a holding voltage) and/or the current through the VLT memory cell decreases below current 235 (e.g., a holding current), the thyristor transitions from the low resistance state into the high resistance state. In some embodiments, current 235 (e.g., a holding current) may be greater than current 205 (e.g., a latching current). In some embodiments, current 235 (e.g., a holding current) may be less than current 205 (e.g., a latching current). When the voltage across the VLT cell decreases below zero, the current through the VLT memory cell follows portion 230 of the IV graph. The high resistance in portion 230 of the IV graph indicates rectifying behavior of the VLT memory cell.

Figure 3:
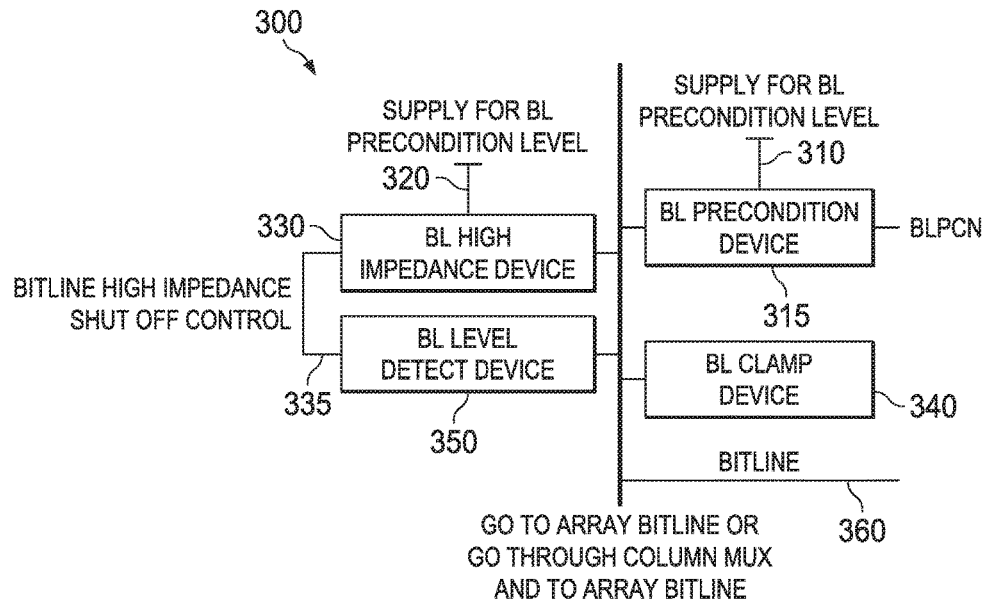
FIG. 3 depicts an apparatus for managing a voltage level on an electrically conducting line connected to a memory cell in a cross-point memory array, in accordance with some embodiments of the present disclosure.

FIG. 3 depicts an apparatus for managing a voltage level on an electrically conducting line connected to a memory cell in a cross-point memory array, in accordance with some embodiments of the present disclosure. In FIG. 3, several devices are illustrated managing the voltage level on the electrically conducting line 360 (e.g., a BL or WL) in a cross-point memory array. FIG. 3 includes a precondition device 315 (e.g., a BL precondition device), a voltage level detect device 350 (e.g., a BL level detect device), a high impedance device 330 (e.g., a BL high impedance device), and/or a clamp device 340 (e.g., a BL clamp device, a voltage clamp, etc.) coupled to an electrically conducting line (e.g., a BL, a WL or a column multiplexor connected to a BL or a row multiplexor connected to WL). As referred to herein, the term "coupled to" may be understood to refer to directly or indirectly connected (e.g., through an electrical connection).

The precondition device 315 may be coupled to a first power supply 310 (e.g., a power supply for a precondition voltage level), and may be coupled to the electrically conducting line 360. The precondition device 315 may precharge the electrically conducting line to a precharge voltage (e.g., provided by first power supply 310) sufficient to transition a VLT memory cell (e.g., from FIG. 1) from a high resistance state to a low resistance state (e.g., to a voltage that is at or above the threshold voltage 205 or latching voltage $V_L$ in FIG. 2). The precondition device 315 may include an input (e.g., BLPCN) used to electrically connect the electrically conducting line 360 to the first power supply 310. In some embodiments, after the first electrically conducting line 360 has been precharged to the precharge voltage, the input (e.g., BLPCN) of the precondition device may be toggled to disconnect the electrically conducting line 360 from the first power supply 310. In some embodiments, before the first electrically conducting line 360 has been precharged to the precharge voltage, the input (e.g., BLPCN) of the precondition device may be toggled to disconnect the electrically conducting line 360 from the first power supply 310, and may precharged by the high impedance device 330.

The high impedance device 330 may be coupled to the electrically conducting line 360, a power supply for the precondition voltage level 320, and the voltage level detect device 350. In some embodiments, the power supply for the precondition voltage level 320 may be same as the first power supply 310. The high impedance device 330 may provide a current to the first electrically conducting line 360 to compensate for leakage currents in order to maintain voltage level on the first electrically conducting line that is at or near precharge voltage (e.g., sufficient to transition a VLT memory cell from a high resistance state to a low resistance state). The high impedance device 330 may include an input that is coupled to an output of the voltage level detect device 350 by a shut-off control signal 335. The high impedance device 330 may be activated after the precondition device 315 is deactivated. In some embodiments, the high impedance device 330 may be used in place of the precondition device 315. In some embodiments, the high impedance device may have an impedance that is sufficient to limit current from the first voltage supply to a selected Bit-line to a level sufficient to counteract the leakage currents. For example, the high impedance device may have an impedance that is greater than 10 M-ohms. For example, the high impedance device may have an impedance that is greater than 100 M-ohms. For example, the high impedance device may have an impedance that is greater than 1 G-ohms. For example, the high impedance device may have an impedance that is greater than 10 G-ohms.

The voltage level detect device 350 (e.g., a BL level detect device) may be coupled to the electrically conducting line 360 and the high impedance device 330. The voltage level detect device may include an output that is coupled to the input of the high impedance device by the shut-off control signal 335. The voltage level detect device 350 may include an input that is coupled to the electrically conducting line 360. Based on detecting that a voltage on the electrically conducting line 360 falls below a threshold (e.g., between second threshold voltage 215, and less than latching voltage 205), the voltage level detect device 350 may generate a shut-off control signal that disables high impedance device 330, causing the high impedance device 330 to disconnect the electrically conducting line 360 from the power supply 320 (which may be the same as first power supply 310). In some embodiments, the high impedance device 330 and/or the voltage level detect device 350 may not be included if leakage currents on the electrically conducting line are low enough such that a current is not needed to maintain a precharge voltage on the electrically conducting line 360.

The clamp device 340 (e.g., a BL clamp device) may be coupled to the electrically conducting line 360 and a second power supply (not shown). The second power supply may provide a voltage (e.g., greater than or equal to a second threshold voltage 215, and less than latching voltage 205) that is sufficient to maintain a VLT memory cell in a conducting state after a transition from a high resistance state to a low resistance state.

Figure 4:
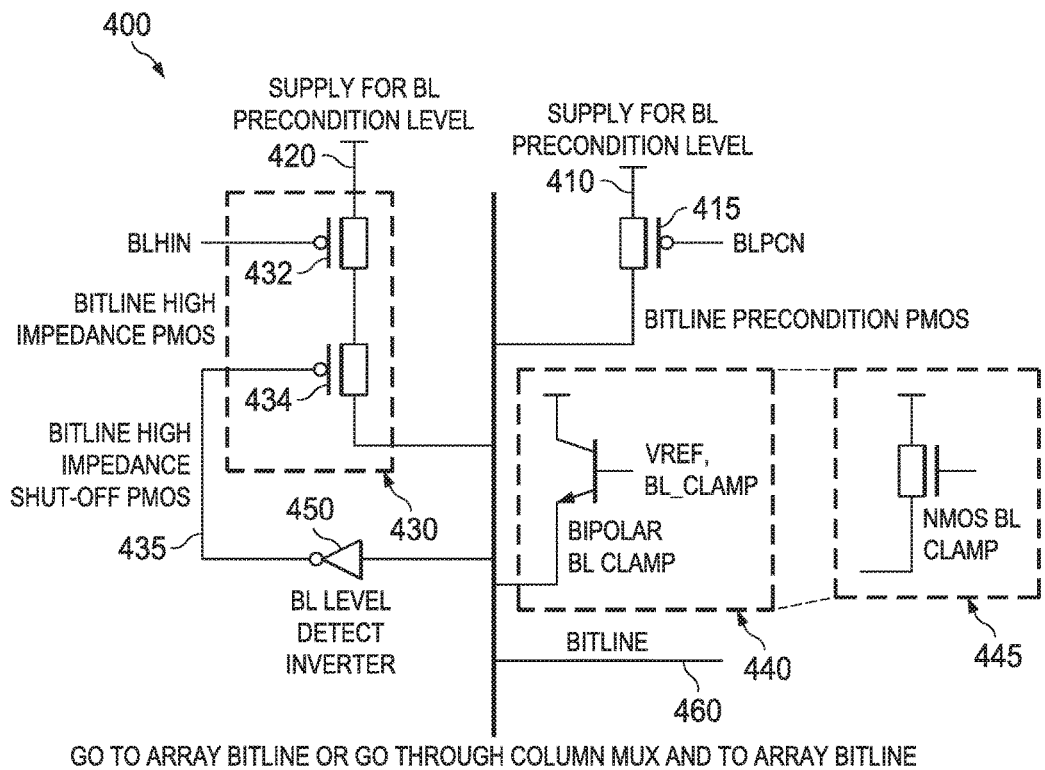
FIG. 4 depicts an apparatus for managing a voltage level on an electrically conducting line connected to a memory cell in a cross-point memory array, in accordance with some embodiments of the present disclosure.

FIG. 4 depicts an apparatus for managing a voltage level on an electrically conducting line connected to a memory cell in a cross-point memory array, in accordance with some embodiments of the present disclosure. In FIG. 4, further details are provided for devices illustrated in FIG. 3, in accordance with some embodiments. The electrically conducting line of FIG. 4 may correspond to the electrically conducting line 360 of FIG. 3. FIG. 4 includes a precondition device 415 that may correspond with precondition device 315, a voltage level detect device 450 that may correspond with voltage level detect device 450, a high impedance device 430 that may correspond with high impedance device 330, and/or a clamp device 440 that may correspond clamp device 330. First power supply 410 may correspond to first power supply 310. Power supply for precondition level 420 may correspond to power supply 320.

The precondition device 415 may be coupled to a first power supply 410 (e.g., a power supply for a precondition voltage level), and may be coupled to the electrically conducting line 460. The precondition device 415 may be a PMOS device that may precharge the electrically conducting line 460 to a precharge voltage (e.g., provided by first power supply 410) sufficient to transition a VLT memory cell (e.g., from FIG. 1) from a high resistance state to a low resistance state (e.g., to a voltage that is at or above the threshold voltage 205 or latching voltage $V_L$ in FIG. 2). The precondition PMOS device 415 may include an input (e.g., BLPCN at a gate of the precondition PMOS device) used to electrically connect the electrically conducting line 460 to the first power supply 410. After the first electrically conducting line 460 has been precharged to the precharge voltage, the input (e.g., BLPCN) of the precondition PMOS device 415 may be toggled to a high voltage to disconnect the electrically conducting line 460 from the first power supply 410.

The high impedance device 430 may be coupled to the electrically conducting line 460, a power supply for the precondition voltage level 420, and the voltage level detect device 450. In some embodiments, the power supply for the precondition voltage level 420 may be same as the first power supply 410. The high impedance device 430 may provide a current to the first electrically conducting line 460 to compensate for leakage currents in order to maintain voltage level on the first electrically conducting line that is at or near precharge voltage (e.g., sufficient to transition a VLT memory cell from a high resistance state to a low resistance state). The high impedance device 430 may include an input that is coupled to an output of the voltage level detect device 450, by a shut-off control signal 435. The high impedance device 430 may be activated after the precondition device 415 is deactivated. In some embodiments, the high impedance device 430 may be used in place of the precondition device 415.

The high impedance device 430 may include a high impedance PMOS device 432 (e.g., a bitline high impedance PMOS) coupled to the power supply 420, and a high impedance shut-off PMOS device 434 (e.g., a bitline high impedance shut-off PMOS device) coupled to the high impedance PMOS device 432 and the electrically conducting line 460. The high impedance PMOS device 432 provides a current for compensating bitline leakage currents in order to maintain the voltage of the electrically conducting line at or near the precharge voltage. The high impedance PMOS device has a high impedance and low current so that it may not pull up a voltage of the electrically conducting line 460 (e.g., which may be coupled to a VLT memory cell)

after a VLT memory cell has been transitioned from a high resistance state to a low resistance state. The high impedance PMOS device 432 may include an input (e.g., BLHIN at a gate of the high impedance PMOS device 432) that may be used to set the level of the current flowing to the electrically conducting line 460.

A high impedance shut-off PMOS device 434 may include an input (e.g., the input of the high impedance device 430 connected to a gate of the high impedance shut-off PMOS device 434) that may be coupled to the output of voltage level detect device 450. When the output (e.g., a shut-off control signal 435) of the voltage level detect device 450 exceeds a threshold voltage of the high impedance shut-off PMOS device 434, the high impedance shut-off PMOS device 434 disconnects the electrically conducting line 460 from high impedance PMOS device 432.

The voltage level detect device 450 (e.g., a BL level detect device) may be coupled to the electrically conducting line 460 and the high impedance device 430. The voltage level detect device 450 may include an output that is coupled to the input of the high impedance device 430 by the shut-off control signal 435. The voltage level detect device 450 may include an input that is coupled to the electrically conducting line 460. Based on detecting that a voltage on the electrically conducting line 460 falls below a threshold (e.g., between second threshold voltage 215, and less than latching voltage 205), the voltage level detect device 450 may generate a shut-off control signal that disables high impedance device 430, causing the high impedance device 430 to disconnect the electrically conducting line 460 from the power supply 420 (which may be the same as first power supply 410). The voltage level detect device 450 may be a CMOS inverter designed with a threshold voltage that is set between second threshold voltage 215, and less than latching voltage 205. When the voltage on electrically conducting line 460 falls below the threshold voltage of the CMOS inverter (e.g., indicating that a VLT memory cell that is coupled to the electrically conducting line 460 has transitioned from a high resistance state to a low resistance state), the output of the CMOS inverter (e.g., the shut-off control signal 435) rises to a voltage high enough to shut off high impedance shut-off PMOS device 434. In some embodiments, the high impedance device 430 and/or the voltage level detect device 450 may not be included if leakage currents on the electrically conducting line are low enough such that a current is not needed to maintain a precharge voltage on the electrically conducting line 460.

The clamp device 440 (e.g., a BL clamp device, a voltage clamp device) may be coupled to the electrically conducting line 460 and a second power supply (not shown). The second power supply may provide a voltage (e.g., greater than or equal to a second threshold voltage 215, and less than latching voltage 205) that is sufficient to maintain a VLT memory cell in a conducting state after a transition from a high resistance state to a low resistance state. In some embodiments, the clamp device 440 may be an NPN bi-polar junction transistor (BJT) device, where a collector of the NPN BJT may be coupled to the second power supply, an emitter of the NPN BJT may be coupled to the electrically conducting line 460, and a base of the NPN BJT may be coupled to a bias voltage. In some embodiments, the clamp device 440 may be an NMOS device 446, where a drain of the NMOS device may be coupled to the second power supply, a source of the NMOS device may be coupled to the electrically conducting line 460, and a gate of the NMOS device may be coupled to a bias voltage.

Figure 5:
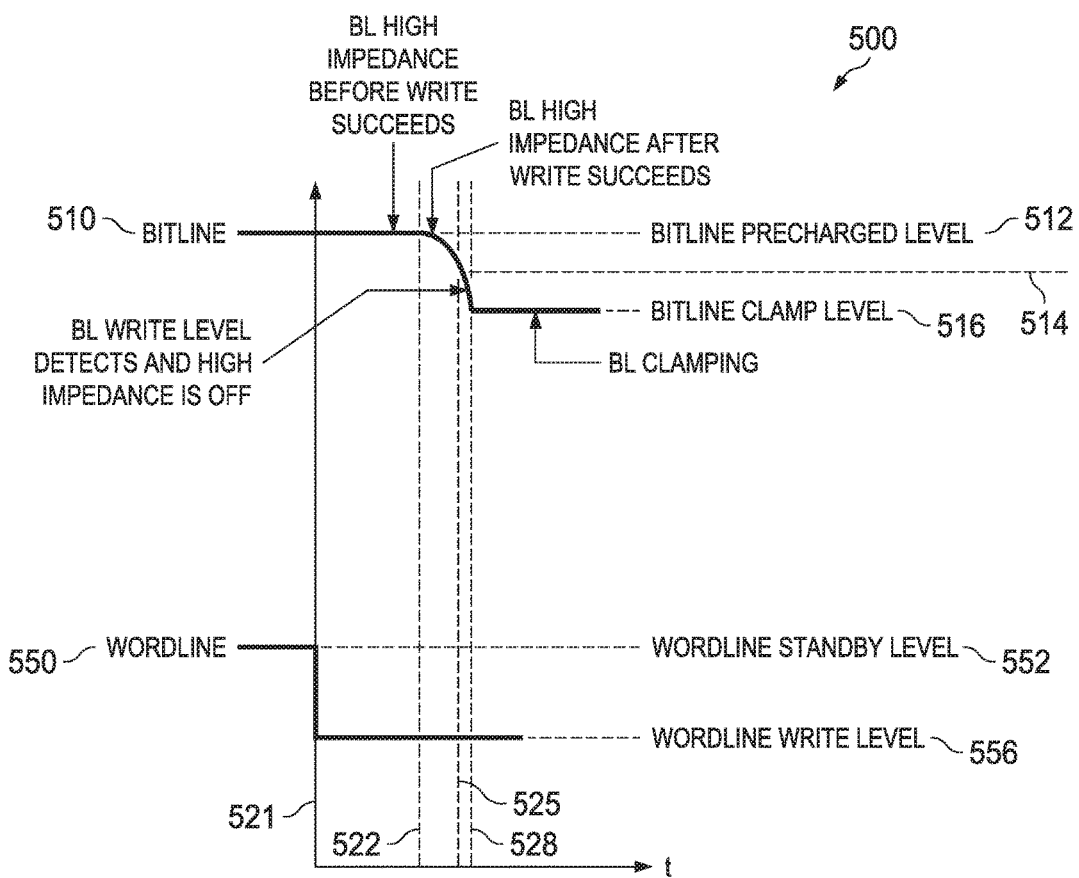
FIG. 5 depicts a timing diagram of voltages applied to a first electrically conducting line of a memory cell and a second electrically conducting line connected to the memory cell, in accordance with some embodiments of the present disclosure.

FIG. 5 depicts a timing diagram of voltages applied to a first electrically conducting line of a VLT memory cell and a second electrically conducting line connected to the VLT memory cell, in accordance with some embodiments of the present disclosure. For example, the first electrically conducting line may correspond to electrically conducting line 360 of FIG. 3, or 460 of FIG. 4. The first electrically conducting line (e.g., 110 of FIG. 1) may be connected to a first terminal of a VLT memory cell (e.g., 100 in FIG. 1), and the second electrically conducting line (e.g., 120 of FIG. 1) connected to a second terminal of the VLT memory cell. FIG. 5 includes a first waveform 510 corresponding to a voltage on the first electrically conducting line, and a second waveform 550 corresponding to a voltage on the second electrically conducting line. In some embodiments, the first electrically conducting line may be a BL, and the second electrically conducting line may be a WL.

As shown in FIG. 5, prior to time 512, a BL voltage of waveform 510 may be initially precharged to a precharge voltage 512 (e.g., precharge voltage as discussed in reference to FIG. 3 and FIG. 4). A precondition device (e.g., 315 or 415) may be disabled, and a high impedance device (e.g., 330, 430) may be enabled to provide a low current to compensate for leakage currents to maintain the voltage of the BL at or near the precharge voltage 512. Prior to time 512, a WL voltage of waveform 550 may be maintained at a standby level 552. In some embodiments, a voltage difference between the BL precharge level and the WL standby level 552 may not be sufficient to transition a VLT memory cell from a high resistance state to a low resistance state (e.g., the voltage difference may be lower than first threshold voltage 205, latching voltage $V_L$).

At time 521, a WL voltage of waveform 550 may transition from WL standby level 552 to WL write level 556. In some embodiments, a voltage difference between the BL precharge level 512 and the WL write level 556 may be sufficient to transition a VLT memory cell from a high resistance state to a low resistance state (e.g., the voltage difference may be greater than first threshold voltage 205, latching voltage $V_L$).

At time 522, the VLT memory cell 100 connected to the BL and WL is in the process of transitioning (or has transitioned from the high resistance state to the low resistance state). As the VLT memory cell 100 becomes more conductive, the BL voltage of waveform 510 begins to fall towards the WL write level 556. The current conducting through the VLT memory cell 100 may be greater than the low current provided by a high impedance device (e.g., 330, 430) so that BL voltage may be pulled towards the WL write level 556. As the VLT memory cell transitions from the high resistance state to the low resistance state (or has transitioned from the high resistance state to the low resistance state), the VLT memory cell may conduct more current. In a cross-point array, as multiple VLT memory cells connected to a same WL transition from a high resistance state to a low resistance state, the cumulative current from the transitioned cells may load the WL and/or a WL driver connected to the WL, affecting the ability to transition other VLT memory cells along the same WL from the high resistance state to the low resistance state. To reduce the amount of cumulative current flowing into the same WL from VLT memory cells that are transitioning or have transitioned from the high resistance state to the low resistance state, high impedance devices (e.g., 330 or 430) on respective BLs may be deactivated to turn off a respective low current, through the use of the voltage level detect device (e.g., 350 or 450).

At time 525, the BL voltage of waveform 510 is pulled past a threshold voltage 514 of voltage level detect device (e.g., 350 or 450). As the BL voltage falls below the threshold voltage, the voltage level detect device outputs a shut-off control signal (e.g., 335 or 435) which shuts off the high impedance device (e.g., 330 or 430), and disconnects the BL from the power supply for the precondition level (e.g., 320, 420) and a low current. The disconnection of the BL from the power supply reduces the current from BL into the WL, reducing the cumulative current on the WL, which may impede the transition of other VLT memory cells on the same WL and/or overload a WL driver. Between time 525 and 528, the BL voltage may be pulled at a faster rate (e.g., as indicated as a steeper slope) towards WL write level 556, because the low current from the high impedance device (e.g., 330 or 430) has been shut off.

At time 528, the BL voltage is maintained at a voltage level 516 (e.g., greater than or equal to a second threshold voltage 215, and less than latching voltage 205) that is sufficient to maintain the VLT memory cell 100 in a conducting state after the transition from the high resistance state to the low resistance state. For example, the BL voltage may be maintained at a clamp level by a clamp device (e.g., 340, 440, 445). Although the aforementioned waveforms have been discussed with waveform 510 corresponding to a BL and waveform 550 corresponding to a WL, it should be understood that the waveform 510 may correspond to a WL and that the waveform 550 may correspond to a BL.

This description has been presented for the purposes of illustration. It is not intended to be exhaustive or to limit the invention to the precise form described, and many modifications and variations are possible in light of the teaching above. For example, PMOS devices may be used in place of NMOS devices, and NMOS devices may be used in place of PMOS devices in suitable configurations. The figures are not drawn to scale and are for illustrative purposes. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. An apparatus for regulating applied voltage in a cross-point memory array during a write operation, the apparatus comprising:
    a first device connected to an electrically conducting line and configured to set a voltage of the electrically conducting line;
    a voltage level detect device comprising an input, connected to the electrically conducting line, and an output;
    a high impedance device comprising an input connected to the output of the voltage level detect device, and an output connected to the electrically conducting line; and
    a clamp device connected to the electrically conducting line.

2. The apparatus of claim 1, wherein the electrically conducting line is a bitline.

3. The apparatus of claim 1, wherein the electrically conducting line is a wordline.

4. The apparatus of claim 1, wherein the clamp device comprises a bipolar junction transistor, wherein at least one of an emitter and a collector of the bipolar junction transistor is connected to a second power supply.

5. The apparatus of claim 1, wherein the clamp device comprises an NMOS transistor, wherein at least one of a source and a drain of the NMOS transistor is connected to a second power supply.

6. The apparatus of claim 1, wherein the voltage level detect device comprises an inverter, wherein an input of the inverter is connected to the input of the voltage level detect device and an output of the inverter is connected to the output of the voltage level detect device.

7. The apparatus of claim 1, wherein the high impedance device comprises:
    a high impedance PMOS transistor; and
    a shut-off PMOS transistor, connected to the high impedance PMOS transistor and the electrically conducting line, comprising a gate connected to the input of the high impedance device.

8. The apparatus of claim 1, wherein the first device comprises a PMOS transistor connected to the electrically conducting line.

9. The apparatus of claim 1, wherein the electrically conducting line is connected to a thyristor memory cell and the first device is connected to a first power supply that provides a first voltage level that is greater than a turn-on voltage of the thryristor memory cell.

10. The apparatus of claim 9, wherein the clamp device is connected to a second power supply that provides a second voltage level that is less than the first voltage level and higher than a turn-off voltage of the thyristor memory cell.

11. An apparatus for regulating applied voltage in a cross-point memory array during a write operation, the apparatus comprising:
    a first device connected to an electrically conducting line and configured to set a voltage of the electrically conducting line;
    a voltage level detect device comprising an input connected to the electrically conducting line and configured to generate a shutoff control signal as an output based on detecting that a voltage level of the electrically conducting line falls below a threshold;
    a high impedance device comprising an input connected to the output of the voltage level detect device, and an output connected to the electrically conducting line, wherein the high impedance device is configured to disconnect a first power supply from the electrically conducting line based on receiving the shutoff control signal from the voltage level detect device; and
    a clamp device connected to the electrically conducting line.

12. The apparatus of claim 11, wherein the electrically conducting line is a bitline.

13. The apparatus of claim 11, wherein the electrically conducting line is a wordline.

14. The apparatus of claim 11, wherein the clamp device comprises a bipolar junction transistor, wherein at least one of an emitter and a collector of the bipolar junction transistor is connected to a second power supply.

15. The apparatus of claim 11, wherein the clamp device comprises an NMOS transistor, wherein at least one of a source and a drain of the NMOS transistor is connected to a second power supply.

16. The apparatus of claim 11, wherein the voltage level detect device comprises an inverter, wherein an input of the inverter is connected to the input of the voltage level detect device and an output of the inverter is connected to the output of the voltage level detect device.

17. The apparatus of claim 11, wherein the high impedance device comprises:

a high impedance PMOS transistor connected to the first power supply; and a shut-off PMOS transistor, connected to the high impedance PMOS transistor and the electrically conducting line, comprising a gate connected to the input of the high impedance device.

18. The apparatus of claim 11, wherein the first device comprises a PMOS transistor connected to the electrically conducting line and the first power supply.

19. The apparatus of claim 11, wherein the electrically conducting line is connected to a thyristor memory cell, and wherein the first power supply provides a first voltage level that is greater than a turn-on voltage of the thryristor memory cell.

20. The apparatus of claim 19, wherein a second power supply, connected to the clamp device, provides a second voltage level that is less than the first voltage level and higher than a turn-off voltage of the thyristor memory cell.

\* \* \* \* \*